US010826190B2

(12) United States Patent
Kim et al.

(10) Patent No.: US 10,826,190 B2
(45) Date of Patent: Nov. 3, 2020

(54) ELECTROMAGNETIC WAVE ABSORBING STRUCTURES INCLUDING METAL-COATED FIBERS AND METHODS OF MANUFACTURING THE SAME

(71) Applicant: AGENCY FOR DEFENSE DEVELOPMENT, Daejeon (KR)

(72) Inventors: Chun-Gon Kim, Daejeon (KR); Young-Woo Nam, Daejeon (KR); Jae-Hun Choi, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 143 days.

(21) Appl. No.: 15/743,710

(22) PCT Filed: Dec. 1, 2016

(86) PCT No.: PCT/KR2016/014045
§ 371 (c)(1),
(2) Date: Jan. 11, 2018

(87) PCT Pub. No.: WO2017/164483
PCT Pub. Date: Sep. 28, 2017

(65) Prior Publication Data
US 2018/0212333 A1    Jul. 26, 2018

(30) Foreign Application Priority Data

Mar. 23, 2016  (KR) .................. 10-2016-0034775

(51) Int. Cl.
*H01Q 17/00* (2006.01)
*B32B 38/08* (2006.01)
*H05K 9/00* (2006.01)

(52) U.S. Cl.
CPC ............ *H01Q 17/00* (2013.01); *B32B 38/08* (2013.01); *H01Q 17/002* (2013.01); *H05K 9/0088* (2013.01)

(58) Field of Classification Search
CPC .... H01Q 17/00; H01Q 17/002; H01Q 17/005; H05K 9/0088; H05K 9/009; B32B 38/08
(Continued)

(56) References Cited

U.S. PATENT DOCUMENTS 6,097,271 A * 8/2000 Kozakoff ................. H01P 3/08
    333/204
9,070,981 B2  6/2015 Park et al.
(Continued)

FOREIGN PATENT DOCUMENTS

JP     1997-241929    9/1997
KR     10-0982019    8/2009
(Continued)

OTHER PUBLICATIONS

Drawings of KR1020120085955 (Year: 2012).*
(Continued)

*Primary Examiner* — Frank J McGue
(74) *Attorney, Agent, or Firm* — LRK Patent Law Firm

(57) ABSTRACT

An electromagnetic wave absorber includes a first layer and a second layer disposed on the first layer. The first layer may include a first reinforcing fiber impregnated in a first matrix. The second layer may include a second reinforcing fiber impregnated in a second matrix. The second reinforcing fiber may be plated with a metal magnetic coating layer. The electromagnetic wave absorber may provide electromagnetic wave absorbing ability with a low uncertainty without reducing mechanical properties due to the metal magnetic coating layer.

6 Claims, 8 Drawing Sheets

(58) Field of Classification Search
USPC .......................................................... 342/1
See application file for complete search history.

(56) References Cited

U.S. PATENT DOCUMENTS 10,654,247 B2 * 5/2020 Naruse ................. H05K 9/0088
2013/0264511 A1 10/2013 Choi et al.

FOREIGN PATENT DOCUMENTS

| KR | 10-2009-0126392 | 12/2009 |
| KR | 10-2012-0085955 | 8/2012 |
| KR | 10-1349029 | 10/2013 |
| KR | 10-2015-0090695 | 8/2015 |

OTHER PUBLICATIONS

Machine Translation of Claims of KR1020120085955 (Year: 2012).*
Machine Translation of KR1020120085955 (Year: 2012).*
Drawings of KR1020150090695 (Year: 2015).*
Machine Translation of claims of KR1020120085955 (Year: 2015).*
Machine Translation of KR1020120085955 (Year: 2015).*
International Search Report of ISA/KR dated Feb. 10, 2017; for PCT/KR2016/014045; 4 pages.

* cited by examiner

ND STRUCTURES INCLUDING
METAL-COATED FIBERS AND METHODS
OF MANUFACTURING THE SAME

ELECTROMAGNETIC WAVE ABSORBING STRUCTURES INCLUDING METAL-COATED FIBERS AND METHODS OF MANUFACTURING THE SAME

CROSS-REFERENCE TO RELATED APPLICATION

This application is a U.S. National Stage of PCT/KR2016/014045 filed in the Korean language on Dec. 1, 2016, entitled: "Electromagnetic Wave Absorber Including Metal-Coated Fiber And Manufacturing Method Therefor" which application claims priority to Korean Application No. 10-2016-0034775 filed on Mar. 23, 2016, which applications are each hereby incorporated herein by reference in their entireties.

BACKGROUND

1. Field

Exemplary embodiments of the inventive concept relate to an electromagnetic wave absorber including a metal-coated fiber and a method for manufacturing the electromagnetic wave absorber. More particularly, exemplary embodiments of the inventive concept relate to an electromagnetic wave absorber including a fiber having a metal magnetic coating layer and a method for manufacturing the electromagnetic wave absorber.

2. Description of the Related Art

A composite material capable of absorbing an electromagnetic wave is used, for example, for a stealth technology. In the stealth technology, an electromagnetic wave is absorbed or scattered so that an object may not be detected by a radar.

Methods for implementing the stealth technology for aircrafts may consider a shaping design, a radar absorbing material (RAM) and a radar absorbing structure (RAS).

The shaping design is performed to reflect an electromagnetic wave from a radar in a direction not heading to the radar based on a step of aircraft design. However, the shaping design may deteriorate aerodynamic characteristics of an aircraft, and it is difficult for the shaping design to solely provide sufficient stealth ability.

The RAM applies a material capable of absorbing an electromagnetic wave to a surface of an aircraft. However, an electromagnetic wave absorbing layer coated by the RAM has a low durability. Thus, repairing for maintenance may be required frequently.

The RAS provides an electromagnetic wave absorber for an aircraft structure in order to compensate for the low durability of the RAM. Thus, the electromagnetic wave absorber may provide a stealth ability as well as a supporting structure for an aircraft.

For example, Korean Granted Patent No. 10-1349029 discloses a composite material including nano-particles dispersed in a matrix.

SUMMARY

Exemplary embodiments provide an electromagnetic wave absorber having superior abilities.

Exemplary embodiments provide a method of manufacturing the above-mentioned electromagnetic wave absorber.

It is to be understood that both the foregoing general description and the following detailed description are exemplary and explanatory and are intended to provide further explanation of the invention as claimed.

According to an exemplary embodiment, an electromagnetic wave absorber includes a first layer and a second layer disposed on the first layer. The first layer may include a first reinforcing fiber impregnated in a first matrix. The second layer may include a second reinforcing fiber impregnated in a second matrix. The second reinforcing fiber may be plated with a metal magnetic coating layer.

In an exemplary embodiment, the metal magnetic coating layer may include at least one ferromagnetic material selected from the group consisting of nickel, cobalt and iron.

In an exemplary embodiment, the first matrix and the second matrix may include a thermo-curable resin.

In an exemplary embodiment, the first and second reinforcing fibers may include a glass fiber or a Kevlar fiber.

In an exemplary embodiment, the first reinforcing fiber may include a metal-uncoated fiber.

In a method of manufacturing an electromagnetic wave absorber according to an exemplary embodiment, a permittivity or a magnetic permeability may be determined according to a target frequency. A metal magnetic coating layer may be formed on a surface of a reinforcing fiber with an amount or a thickness corresponding the permittivity or the magnetic permeability. The reinforcing fiber having the metal magnetic coating layer may be impregnated with a thermo-curable resin.

In an exemplary embodiment, combination of a real part and an imaginary part of an optimized permittivity according to the target frequency may be generated to determine the permittivity or the magnetic permeability according to the target frequency.

In an exemplary embodiment, Cole-Cole plot satisfying a non-reflection condition in the electromagnetic wave absorber may be used to generate combination of the real part and the imaginary part of the optimized permittivity according to the target frequency.

In an exemplary embodiment, the metal magnetic coating layer may be formed through an electroless plating coating process dipping the reinforcing fiber in a metal salt aqueous solution including a metal salt compound and a reducing agent.

In an exemplary embodiment, the metal salt compound may include a nickel salt compound, and the reducing agent includes a phosphate salt or a boron compound.

In an exemplary embodiment, the metal magnetic coating layer may include a nickel-phosphorous (Ni—P) alloy or a nickel-boron (Ni—B) alloy.

According to the exemplary embodiments of the present inventive concept, a reinforcing fiber having a metal magnetic coating layer may be provided in a matrix of an electromagnetic wave absorber. Since an electromagnetic wave absorbing material is provided to the reinforcing fiber as a coating layer, uncertainty such as irregular dispersion may be reduced. Furthermore, an amount and/or a thickness of the metal magnetic coating layer may be adjusted according to an optimized permittivity or an optimized magnetic permeability of a target frequency.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
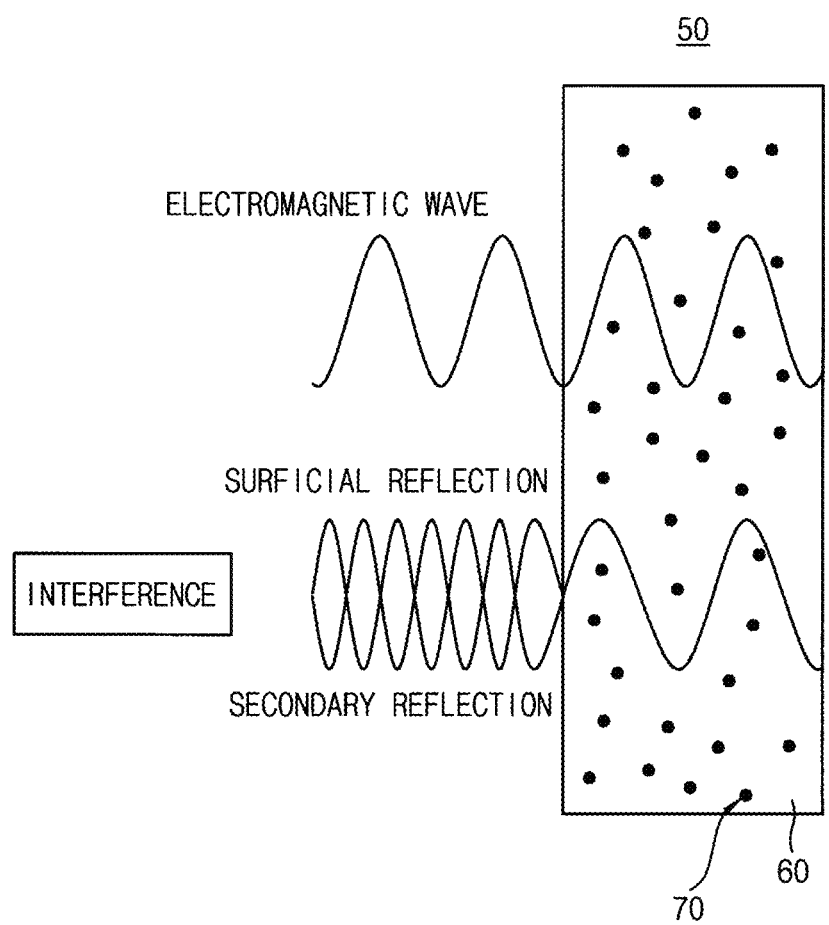
FIG. 1 is a cross-sectional view illustrating an electromagnetic wave absorber according to an comparative embodiment.

Exemplary embodiments are described more fully hereinafter with reference to the accompanying drawings. The inventive concept may, however, be embodied in many different forms and should not be construed as limited to the exemplary embodiments set forth herein. In the drawings, the sizes and relative sizes of layers and regions may be exaggerated for clarity.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an electromagnetic wave absorber according to a comparative embodiment.

Referring to FIG. 1, an electromagnetic wave absorber 50 according to a comparative embodiment may include a matrix 60 and nano-particles 70 dispersed in the matrix 60.

For example, the matrix 60 may include an epoxy-based prepreg including a fiber, such as a glass fiber, impregnated with an epoxy resin. The nano-particles 70 may include a carbon-based material such as carbon black, carbon nanotube (CNT), carbon nano-fiber or the like. An electromagnetic wave, which is incident on the electromagnetic wave absorber 50, may be absorbed or scattered by the nano-particles 70.

For example, as illustrated in FIG. 1, when an electromagnetic wave is incident on a front surface of the electromagnetic wave absorber 50, a portion of the electromagnetic wave may be surface-reflected at the front surface, and a portion of the electromagnetic wave may be secondly-reflected at a rear surface. The electromagnetic wave may be removed by destructive interference of the surface-reflected portion and the secondly-reflected portion.

However, in order to form the electromagnetic wave absorber 50 according to a comparative embodiment, a large amount of nano-particles are supposed to be dispersed by the matrix 60. Thus, dispersion of the nano-particles may be changed depending on conditions of a dispersion process thereby increasing uncertainty. Therefore, it may be difficult to precisely design an electromagnetic wave absorber capable of absorbing an electromagnetic wave in a desired range.

Furthermore, when an additional material such as a filler is added into the matrix 60 to reinforce a strength of the electromagnetic wave absorber 50, a viscosity of the matrix 70 increases. Thus, dispersing the nano-particles 70 may be more difficult. Additionally, when an amount of the nano-particles 70 is increased in order to increase an electromagnetic wave absorbing ability, a volume ratio of the fiber based on a unit volume of the electromagnetic wave absorber 50 may be reduced. Thus, mechanical properties of the electromagnetic wave absorber 50 may be deteriorated.

Figure 2:
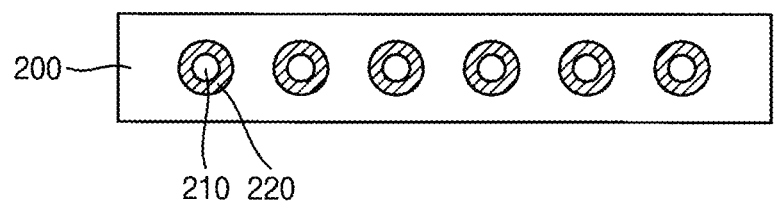
FIG. 2 is a cross-sectional view illustrating an electromagnetic wave absorber according to exemplary embodiments.

FIG. 2 is a cross-sectional view illustrating an electromagnetic wave absorber according to exemplary embodiments.

Referring to FIG. 2, an electromagnetic wave absorber 100 may include a reinforcing fiber 210 impregnated in a matrix 200. Thus, the electromagnetic wave absorber 100 may be used for a composite material as a fiber-impregnated prepreg.

The matrix 200 may include a polymeric resin such as an epoxy resin, a phenol resin, a polyimide resin, a polyacryl resin or the like. In an exemplary embodiment, a thermo-curable resin such as an epoxy resin may be used for the matrix 200.

In exemplary embodiments, a glass fiber or an aromatic polyamide-based fiber may be used for the reinforcing fiber 210. In an exemplary embodiment, an aramid fiber such as Kevlar may be used for the reinforcing fiber 210.

A metal magnetic coating layer 220 may be formed on a surface of the reinforcing fiber 210.

In exemplary embodiments, the metal magnetic coating layer 220 may include a ferromagnetic material such as nickel (Ni), cobalt (Co), iron (Fe) or the like. In an exemplary embodiment, the metal magnetic coating layer 220 may include nickel.

As previously explained, the electromagnetic wave absorber 100 is based on a composite material including the reinforcing fiber 210 impregnated therein. Thus, the electromagnetic wave absorber 100 may have improved mechanical properties such as shear stress, heat resistance or the like. Thus, the electromagnetic wave absorber 100 may be directly applied to a supporting structure for an aircraft or the like.

Furthermore, because the metal magnetic coating layer 220 including a ferromagnetic material is formed on a surface of the reinforcing fiber 210, an eddy current may be formed near the reinforcing fiber 210 according to Lentz's law when an electromagnetic wave enters the electromagnetic wave absorber 100 from an exterior. Because the eddy current is formed in an inverse direction to the electromagnetic wave, an intensity of the electromagnetic wave entering the electromagnetic wave absorber 100 may be reduced.

In exemplary embodiments, the metal magnetic coating layer 220 may be formed by an electroless plating process, which will be explained with reference to FIG. 4.

For example, when a skin depth is defined by a depth with which a current may penetrate into a material, a thickness of the metal magnetic coating layer 220 may be smaller than the skin depth. Thus, a conductivity of the metal magnetic coating layer 220 may be reduced. Therefore, the reinforcing fiber 210 may be used for a material of the metal magnetic coating layer 220.

A thickness of the metal magnetic coating layer 220 may be adjusted with a scale less than 100 nm by the electroless plating process. Thus, the metal magnetic coating layer 220 may be formed with a thickness smaller than the skin depth.

According to exemplary embodiments, an electromagnetic wave absorbing ability may be provided by the metal magnetic coating layer 220 formed on a surface of the reinforcing fiber 210. Thus, a process dispersing nanoparticles as the comparative embodiment is not required. Therefore, uncertainty of an electromagnetic wave absorbing ability such as irregular dispersion may be reduced.

Furthermore, because the metal magnetic coating layer 220 is provided as a thin film with the reinforcing fiber 210 in the matrix 200, a volume ratio of the reinforcing fiber 210 based on a total volume of the electromagnetic wave absorber 100 may be desirably maintained. Thus, an electromagnetic wave absorbing ability may be achieved without reducing mechanical properties of the electromagnetic wave absorber 100.

Figure 3:
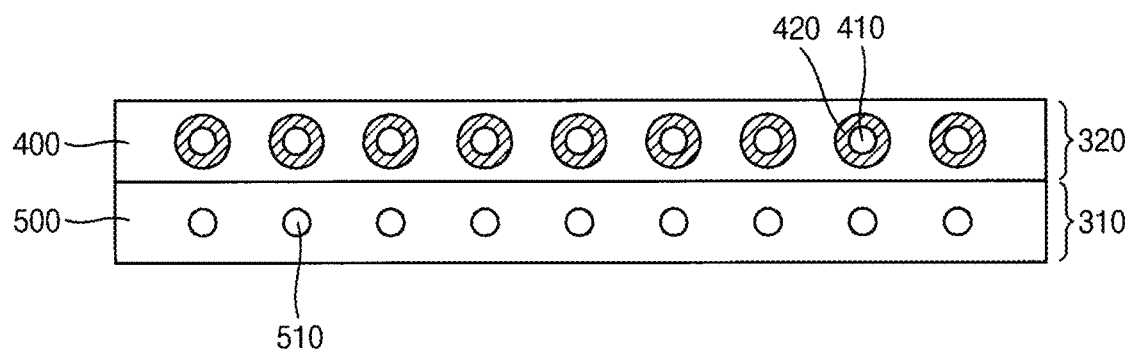
FIG. 3 is a cross-sectional view illustrating an electromagnetic wave absorber according to exemplary embodiments.

FIG. 3 is a cross-sectional view illustrating an electromagnetic wave absorber according to exemplary embodiments.

Referring to FIG. 3, an electromagnetic wave absorber 300 may have a double-layered structure, for example, including a first layer 310 and a second layer 320.

The first layer 310 may include a first reinforcing fiber 510 impregnated in a first matrix 500. The first matrix 500 may include a thermo-curable resin such as an epoxy resin, a phenol resin or the like. For example, the first reinforcing fiber 510 may include a glass fiber or a Kevlar fiber.

As previously explained, the first layer 310 may be provided as a prepreg composite material and may function as a supporting layer of the electromagnetic wave absorber 300.

The second layer 320 may have configuration or structure, which is similar to or same as the electromagnetic wave absorber 100 illustrated in FIG. 2.

The second layer 320 may include a second reinforcing fiber 410 impregnated in a second matrix 400. A metal magnetic coating layer 420 may be formed on a surface of the second reinforcing fiber 410.

The second matrix 400 may include a thermo-curable resin substantially same as the first matrix 500. In an exemplary embodiment, the second matrix 400 may include a thermo-curable resin different from the first matrix 400.

As previously explained, the second reinforcing fiber 410 may include, for example, a glass fiber or a Kevlar fiber. The metal magnetic coating layer 420 may include a ferromagnetic material such as nickel, iron or cobalt, and may be formed by an electroless plating process.

According to exemplary embodiments, mechanical properties of the electromagnetic wave absorber 300 may be improved by the first layer 310 including the metal-uncoated first reinforcing fiber 510. Furthermore, an electromagnetic wave absorbing ability may be achieved by the metal magnetic coating layer 420 of the second layer 320.

Furthermore, because the electromagnetic wave absorber 300 has a double-layered structure, an electromagnetic wave may be secondly reflected at an interface between the first layer 310 and the second layer 320. Thus, an electromagnetic wave absorbing ability may be improved.

Figure 4:
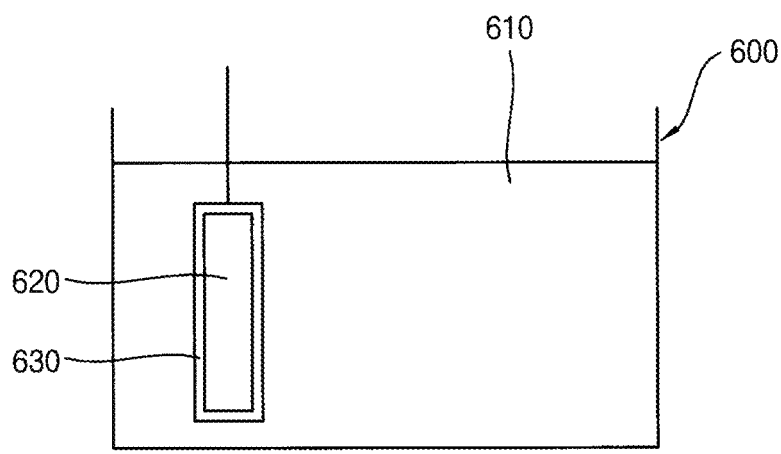
FIG. 4 is a view explaining a plating process of a reinforcing fiber of an electromagnetic wave absorber according to exemplary embodiments.

FIG. 4 is a view explaining a plating process of a reinforcing fiber of an electromagnetic wave absorber according to exemplary embodiments.

Referring to FIG. 4, a metal magnetic coating layer 630 may be formed on a surface of a reinforcing fiber 620 by an electroless plating process.

As illustrated in FIG. 4, the reinforcing fiber 620 may be dipped in a metal salt aqueous solution 610 contained in a plating bath 600 to form the metal magnetic coating layer 630 on the surface of the reinforcing fiber 620.

The metal salt aqueous solution 610 may include a metal salt compound and a reducing agent. The metal salt compound may include a nickel salt compound. For example, the nickel salt compound may include nickel sulfate, nickel acetate or nickel chloride. These can be used each alone or in a combination thereof.

Because the reducing agent is included in the metal salt aqueous solution 610, auto catalytic plating may be substantially performed. According to the auto catalytic plating, the metal magnetic coating layer 630 may be formed by catalytic reaction of precipitation metal and chemical energy by the reducing agent without exterior electric energy supplied thereto.

Thus, irregular current distribution may be removed, and a uniform plating layer may be formed on the surface of the reinforcing member 620. Thus, a uniform electromagnetic wave absorbing ability may be achieved for a desired target frequency range across an entire area of the electromagnetic wave absorber.

A compound optimized for nickel plating may be selected as the reducing agent. In an exemplary embodiment, a boron compound such as methyl amine boron, or a phosphate such as sodium hypophosphite may be used for the reducing agent. When a concentration of the reducing agent increases, a concentration of phosphorous or boron increases, and a plating speed may be increased.

For example, when sodium hypophosphite is used for the reducing agent, the metal magnetic coating layer 630 may include nickel-phosphorous alloy. When the boron compound is used for the reducing agent, the metal magnetic coating layer 630 may include nickel-boron alloy. As a dopant such as phosphorous or boron is included in the metal magnetic coating layer 630, mechanical properties such as a hardness and an abrasion resistance may be increased, for example, with compared to a plating layer formed by an electrical plating process.

For example, when nickel sulfate and sodium hypophosphite are used for the metal salt compound and the reducing agent, auto catalytic plating may be performed according to the following Reaction Formula.

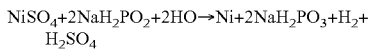

In an exemplary embodiment, a pH-adjusting agent may be further included in the metal salt aqueous solution 610. For example, a pH of the metal salt aqueous solution 610 may be maintained in a pH range of 4 to 6 by the pH-adjusting agent. Examples of the pH-adjusting agent may include sodium hydroxide or ammonia.

In an exemplary embodiment, the metal salt aqueous solution 610 may further include a stabilizer, a surfactant or the like for protecting the plating bath 600 and preventing irregular precipitation. Examples of the stabilizer may include a salt compound of a heavy metal such as lead (Pb), cadmium (Cd) or the like.

In an exemplary embodiment, the reinforcing fiber 620 having the metal magnetic coating layer 630 coated thereon is separated from the plating bath 600 after the eletroless plating process, and a heat-treating process may be further formed. Adhesion between the reinforcing fiber 620 and the metal magnetic coating layer 630, and a strength of the metal magnetic coating layer 630 may be increased by the heat-treating process. For example, the heat-treating process may be performed at about 300° C. to about 500° C. for about 1 hour to about 2 hours.

Figure 5:
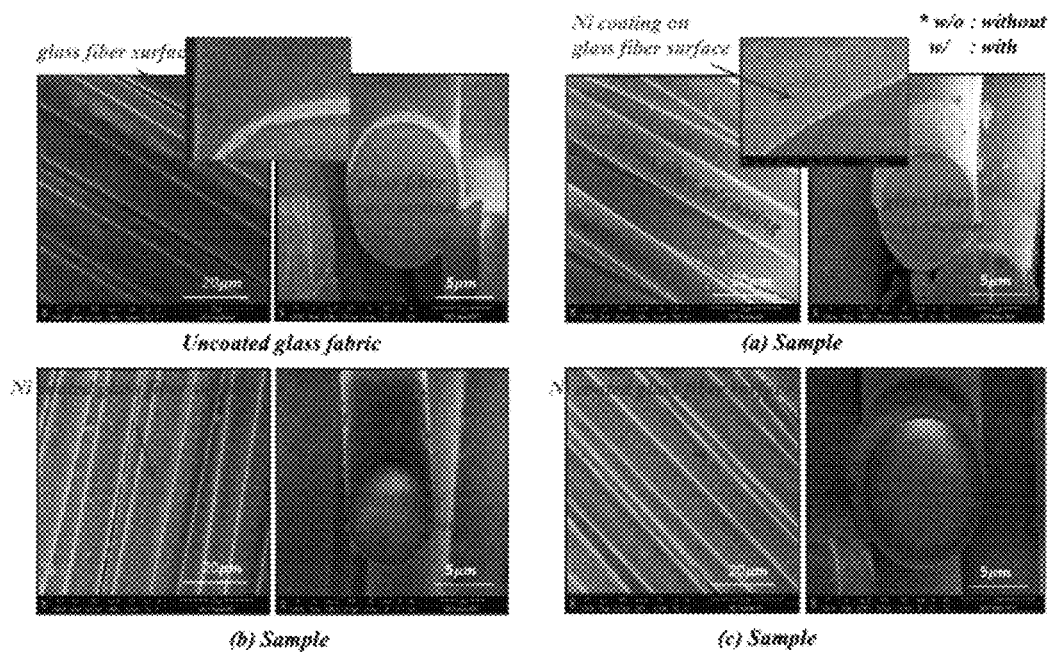
FIG. 5 are scanning electron microscope (SEM) images showing samples of an uncoated glass fabric and nickel-plated glass fabrics.
Figure 6:
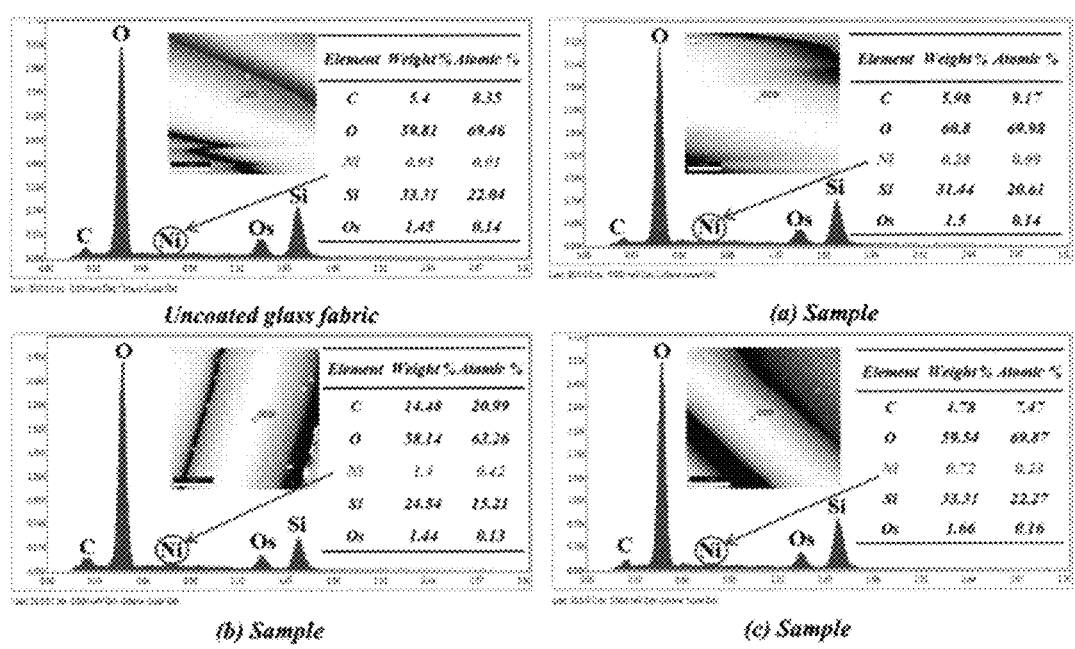
FIG. 6 are energy dispersive spectroscopy (EDS) graphs of the uncoated glass fabric and the nickel-plated glass fabrics shown in FIG. 5.

FIG. 5 are scanning electron microscope (SEM) images showing samples of an uncoated (pristine) glass fabric and nickel-plated glass fabrics. FIG. 6 are energy dispersive spectroscopy (EDS) graphs of the uncoated glass fabric and the nickel-plated glass fabrics shown in FIG. 5.

Referring to FIGS. 5 and 6, it can be noted that a metal magnetic coating layer may formed, for example, by an electroless plating process for plating nickel on a surface of a glass fabric as explained with reference to FIG. 4.

As shown in FIGS. 5 and 6, nickel was not substantially detected in the uncoated glass fabric. However, it can be noted that a nickel-coated layer having a nano-scale was formed with about 0.09 at % to about 0.42 at % or about 0.28 wt % to about 1.4 wt % in the samples (a) to (c).

Figure 7:
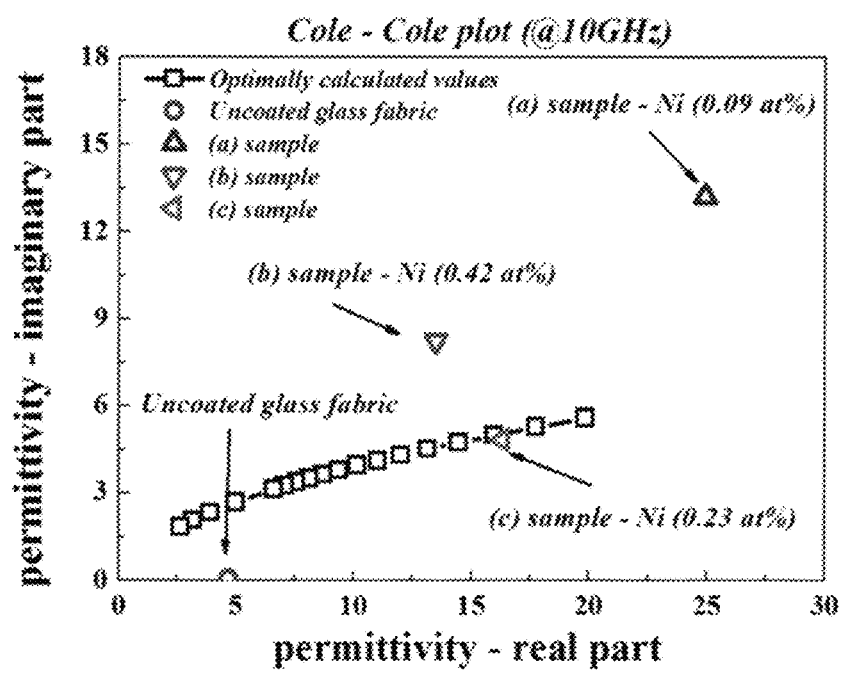
FIG. 7 is a graph for explaining permittivity design to satisfy non-reflection condition at a target frequency.

FIG. 7 is a graph for explaining permittivity design to satisfy non-reflection condition at a target frequency. For example, FIG. 7 shows optimized permittivity design at a target frequency, which is 10 GHz, using Cole-Cole Plot, and shows permittivity values of the samples of FIGS. 5 and 6.

Referring to FIG. 7, optimally designed value of real part and imaginary part of the permittivity, which can satisfy non-reflection condition at 10 GHz, may be represented by the quadrangle group through Cole-Cole Plot.

As shown in FIG. 7, it can be noted that the sample (c) containing 0.23 at % of nickel crosses the optimally designed curve.

As previously explained, an optimized permittivity value at a predetermined target frequency may be determined, for example, through Cole-Cole Plot. An amount and a permittivity of a ferromagnetic material may be designed to be close to the optimized permittivity value.

In an exemplary embodiment, amounts of the metal salt compound and the reducing agent in the metal salt aqueous solution explained with reference to FIG. 4 may be adjusted to be close to the optimized permittivity value.

Figure 8A:
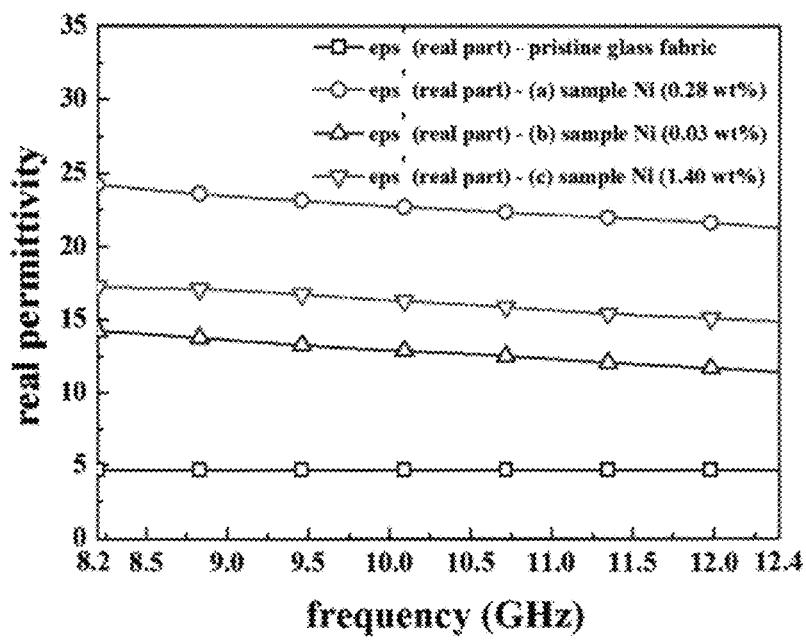
FIGS. 8A and 8B are graphs showing permittivity variation of a prepreg including a nickel-coated glass fabric at X-band frequency.
Figure 8B:
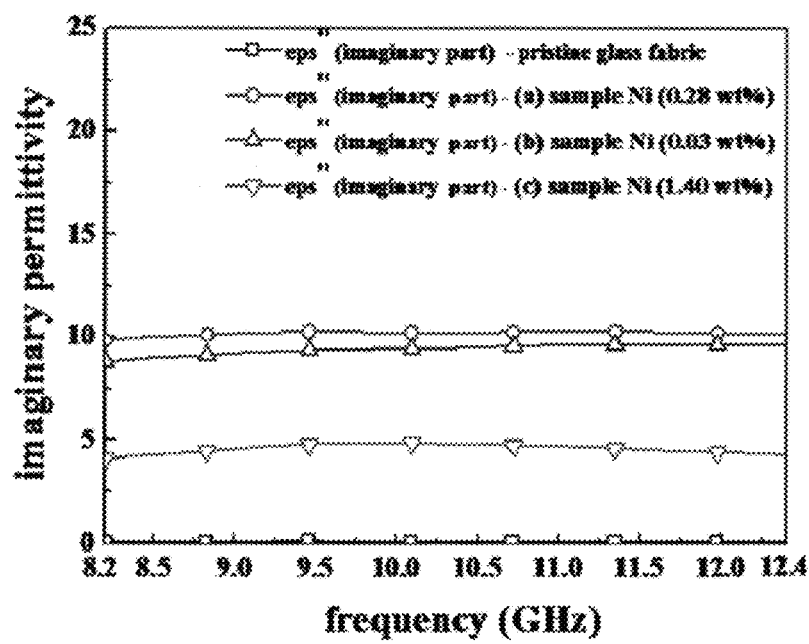

FIGS. 8A and 8B are graphs showing permittivity variation of a prepreg including a nickel-coated glass fabric at X-band frequency. Particularly, FIGS. 8A and 8B illustrates real part and imaginary part of the permittivity of the samples and the uncoated glass fabric of FIGS. 5 and 6, respectively.

As illustrated in FIGS. 8A and 8B, a ferromagnetic material such as nickel may have a relatively variable permittivity depending on a target frequency. Thus, optimized permittivity design of an electromagnetic wave absorber may be implemented in response to the target frequency.

Figure 9A:
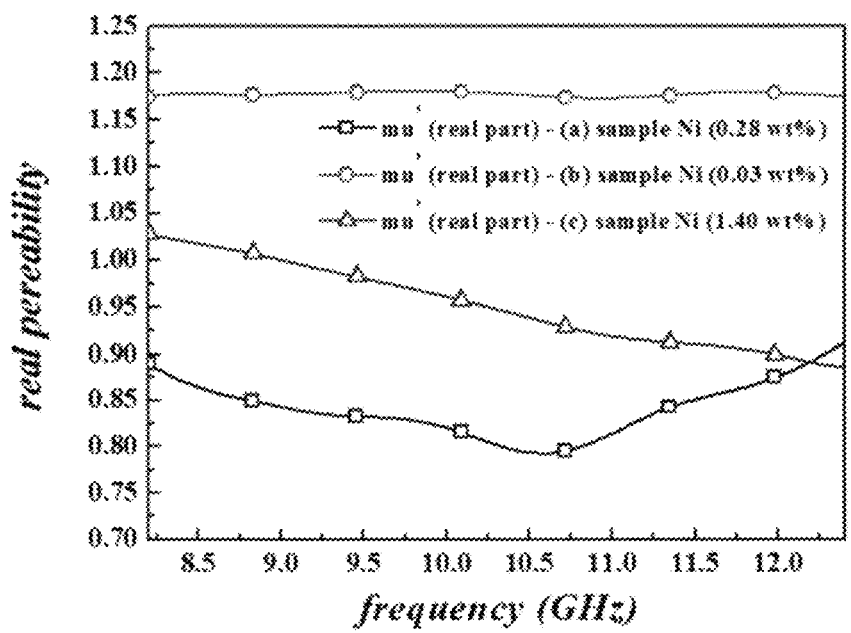
FIGS. 9A and 9B are graphs showing magnetic permeability variation of a prepreg including a nickel-coated glass fabric at X-band frequency.
Figure 9B:
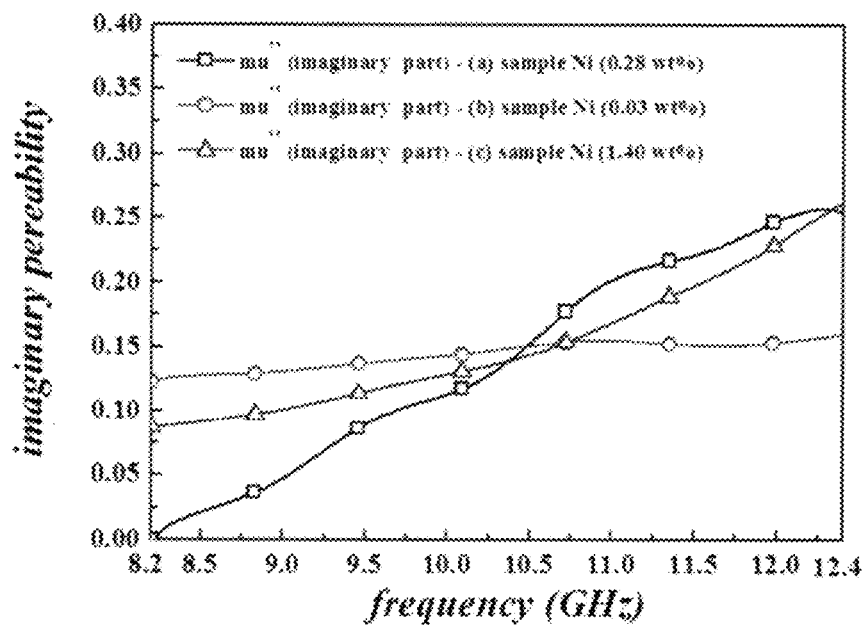

FIGS. 9A and 9B are graphs showing magnetic permeability variation of a prepreg including a nickel-coated glass fabric at X-band frequency. Particularly, FIGS. 9A and 9B illustrates real part and imaginary part of the magnetic permeability of the samples and the uncoated glass fabric of FIGS. 5 and 6, respectively.

As illustrated in FIGS. 9A and 9B, it can be noted that magnetic permeability variation of the ferromagnetic samples is relatively large depending on frequency variation.

An electromagnetic wave absorber may be designed by matching input impedance with varying a material and a thickness of each layers. In the electromagnetic wave absorber, as a designed input impedance is close to an intrinsic impedance of a free space, return loss such as electromagnetic wave absorbing ability may be superior. For example, in order to optimize electromagnetic wave absorbing ability at a target frequency band, a thickness of an electromagnetic wave absorbing material may be about ¼ of an electromagnetic wavelength in the material. However, a permittivity or a magnetic permeability of an usual insulator has almost fixed value in a microwave band. Thus, a condition for ¼ thickness of an electromagnetic wavelength is very limited.

However, when the previously explained ferromagnetic material is used for an electromagnetic wave absorber, because the magnetic permeability variation is large in the microwave band, as illustrated in FIGS. 9A and 9B, the condition for ¼ thickness of an electromagnetic wavelength may be enlarged, and design for a wideband electromagnetic wave absorber may be implemented.

Figure 10:
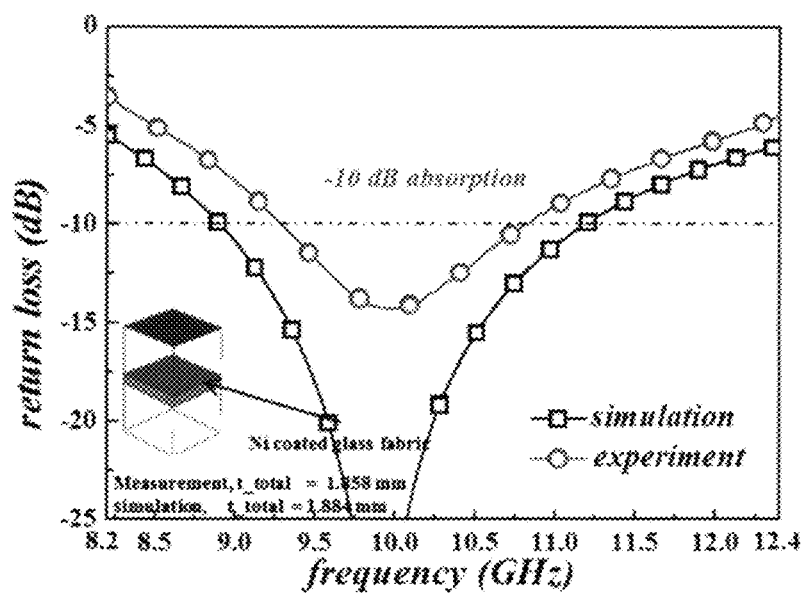
FIG. 10 is a graph showing return loss in a single-layered prepreg composite material including a nickel-coated glass fabric.

FIG. 10 is a graph showing return loss in a single-layered prepreg composite material including a nickel-coated glass fabric. For example, FIG. 10 shows return loss of an electromagnetic wave absorber explained with reference to FIG. 2.

Referring to FIG. 10, an electromagnetic wave absorber including a nickel-coated glass fabric and having a total thickness of about 1.884 mm has return loss of about 15 dB at the target frequency of 10 GHz (effective return loss: 10 dB).

Figure 11:
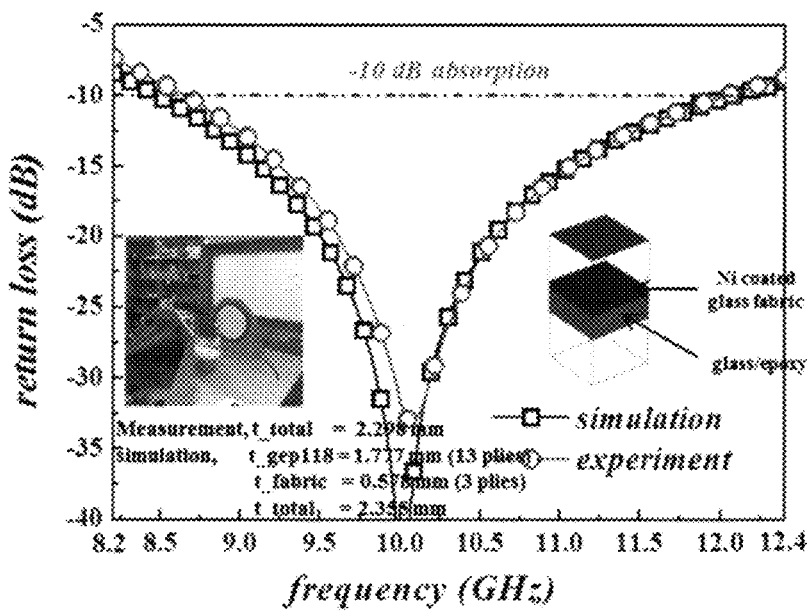
FIG. 11 is a graph showing return loss in a double-layered prepreg composite material including a nickel-coated glass fabric.

FIG. 11 is a graph showing return loss in a double-layered prepreg composite material including a nickel-coated glass fabric. For example, FIG. 11 shows return loss of an electromagnetic wave absorber explained with reference to FIG. 3.

Referring to FIG. 11, an electromagnetic wave absorber includes a first layer including an epoxy/glass fabric prepreg and a second layer deposited on the first layer and including a nickel-coated glass fabric prepreg. The electromagnetic wave absorber has a total thickness of about 2.298 mm. The electromagnetic wave absorber has return loss of about 35 dB at the target frequency of 10 GHz.

As illustrated in FIG. 11, when an electromagnetic wave absorber has a double-layered structure, return loss or electromagnetic wave absorbing ability may be further increased. For example, variables, which can vary for optimized design, such as a permittivity or a magnetic permeability may be adjusted in each layers. Thus, electromagnetic wave absorbing ability may be further optimized.

Figure 12:
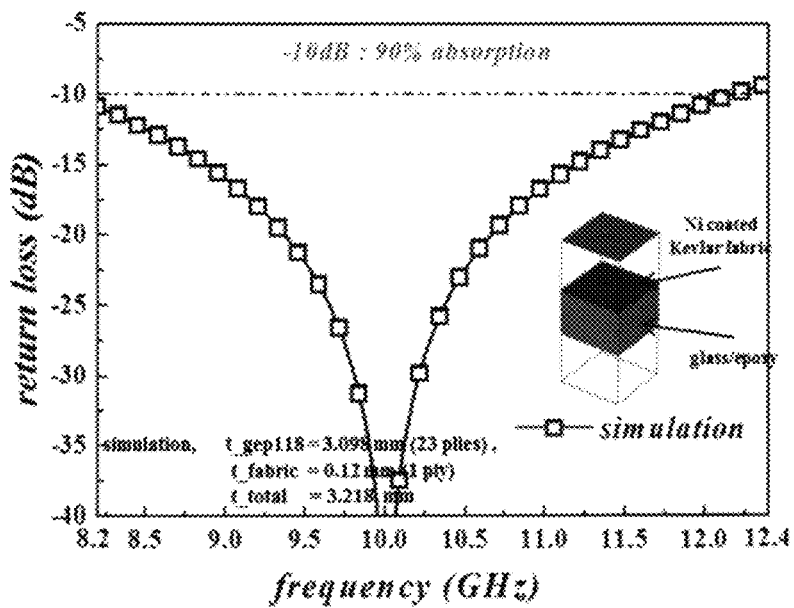
FIG. 12 is a graph showing return loss in a double-layered prepreg composite material including a nickel-coated Kevlar fabric.

FIG. 12 is a graph showing return loss in a double-layered prepreg composite material including a nickel-coated Kevlar fabric. For example, FIG. 12 shows return loss of an electromagnetic wave absorber explained with reference to FIG. 3.

Referring to FIG. 12, an electromagnetic wave absorber includes a first layer including an epoxy/glass fabric prepreg and a second layer deposited on the first layer and including a nickel-coated Kevlar fabric prepreg. The electromagnetic wave absorber has a total thickness of about 3.218 mm. The electromagnetic wave absorber has return loss of about 45 dB at the target frequency of 10 GHz.

Figure 13:
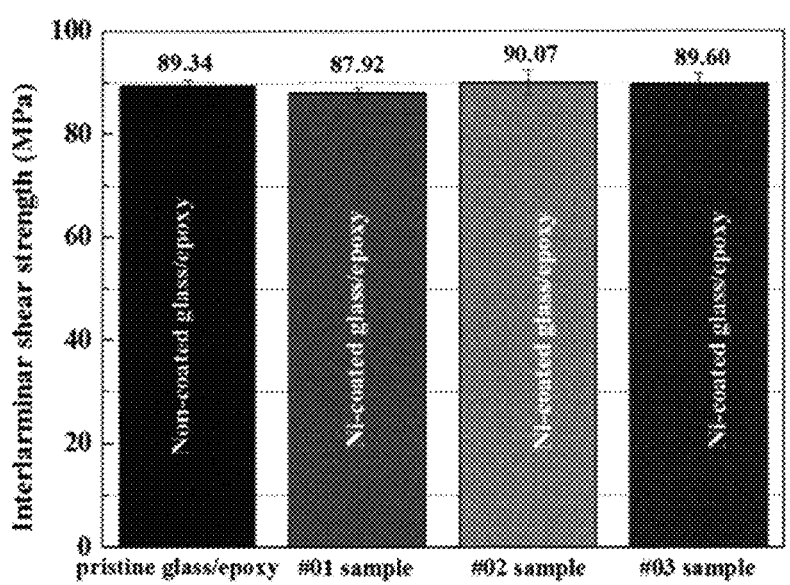
FIG. 13 is a graph illustrating an interlaminar shear strength of nickel-coated fabric prepreg samples, which was measured according to ASTM D2344.

FIG. 13 is a graph showing an interlaminar shear strength of nickel-coated fabric prepreg samples, which was measured according to ASTM D2344. Particularly, FIG. 13 is a graph showing an interlaminar shear strength of prepregs including an uncoated glass fabric and nickel-coated glass fabric samples of FIGS. 5 and 6.

Referring to FIG. 13, a prepreg including a nickel-coated glass fabric has a substantially same or similar interlaminar shear strength as a prepreg including an uncoated glass fabric. Thus, uncertainty of electromagnetic wave absorbing ability may be removed by a magnetic metal coating layer, and structural stability may be achieved.

According to exemplary embodiments, an interlaminar shear strength of a prepreg including an impregnated reinforcing fiber having a magnetic metal coating layer with respect to a prepreg including an impregnated reinforcing fiber according to ASTM standard may be adjusted in a desired range. Thus, desired mechanical properties of an electromagnetic wave absorber may be obtained.

Electromagnetic wave absorbers according to exemplary embodiments may be used for a cutting edge mechanical field, to which a stealth technology may be applied, such as an aerospace field.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A method of manufacturing an electromagnetic wave absorber, the method comprising:
   determining a permittivity or a magnetic permeability according to a target frequency;
   forming a metal magnetic coating layer on a surface of a second reinforcing fiber with an amount or a thickness corresponding to the permittivity or the magnetic permeability; and
   impregnating the second reinforcing fiber in a second matrix, the second reinforcing fiber being plated with the metal magnetic coating layer,
   wherein a second layer including the second reinforcing fiber is disposed on a first layer including a first reinforcing fiber impregnated in a first matrix, and
   wherein the first matrix and the second matrix include a thermo-curable resin.

2. The method of claim 1, wherein determining the permittivity or the magnetic permeability according to the target frequency includes generating combination of a real part and an imaginary part of an optimized permittivity according to the target frequency.

3. The method of claim 2, wherein generating combination of the real part and the imaginary part of the optimized permittivity according to the target frequency uses Cole-Cole plot satisfying a non-reflection condition in the electromagnetic wave absorber.

4. The method of claim 1, wherein forming the metal magnetic coating layer including dipping the reinforcing fiber in a metal salt aqueous solution including a metal salt compound and a reducing agent to perform an electroless plating coating.

5. The method of claim 4, wherein the metal salt compound includes a nickel salt compound, and the reducing agent includes a phosphate salt or a boron compound.

6. The method of claim 5, wherein the metal magnetic coating layer includes a nickel-phosphorous (Ni—P) alloy or a nickel-boron (Ni—B) alloy.

* * * * *